(12) United States Patent
Mathieu

(10) Patent No.: US 10,966,008 B1
(45) Date of Patent: Mar. 30, 2021

(54) ELECTRONIC DEVICE WITH FORCE ELEMENT

(71) Applicant: Bose Corporation, Framingham, MA (US)

(72) Inventor: Randall Mathieu, Hudson, MA (US)

(73) Assignee: Bose Corporation, Framingham, MA (US)

( * ) Notice: Subject to any disclaimer, the term of this patent is extended or adjusted under 35 U.S.C. 154(b) by 0 days.

(21) Appl. No.: 16/740,832

(22) Filed: Jan. 13, 2020

(51) Int. Cl.
  *H04R 1/02* (2006.01)
  *H04R 9/06* (2006.01)
  *H04R 1/28* (2006.01)
  *H05K 7/20* (2006.01)

(52) U.S. Cl.
  CPC ........... *H04R 1/028* (2013.01); *H04R 1/2811* (2013.01); *H05K 7/2049* (2013.01); *H03F 2200/03* (2013.01); *H05K 2201/10227* (2013.01); *H05K 2203/02* (2013.01)

(58) Field of Classification Search
  CPC ..... H04R 1/028; H04R 1/2811; G05K 7/2049
  See application file for complete search history.

(56) References Cited

U.S. PATENT DOCUMENTS

| | | | | |
|---|---|---|---|---|
| 3,987,258 | A * | 10/1976 | Tsutsui | H04R 1/44 381/334 |
| 6,297,448 | B1 * | 10/2001 | Hara | H05K 5/0047 174/50.5 |
| 6,816,381 | B2 * | 11/2004 | Takeuchi | H05K 7/1417 174/50 |
| 7,679,917 | B2 | 3/2010 | Deck et al. | |
| 2008/0196918 | A1 * | 8/2008 | Zadach | H05K 5/0213 174/50.5 |

* cited by examiner

Primary Examiner — Simon King
(74) Attorney, Agent, or Firm — Hoffman Warnick LLC

(57) ABSTRACT

Various implementations include force elements for electronic devices. In some aspects, a force element includes: an outer ring surrounding a central axis and having a first diameter; an inner ring surrounding the central axis and having a second diameter that is smaller than the first diameter; an outer wall connecting a radially inner portion of the outer ring with a radially outer portion of the inner ring; an inner wall extending from a radially inner portion of the inner ring and located radially inboard of the outer wall; and a central platform extending from the inner wall around the central axis.

25 Claims, 6 Drawing Sheets

ELECTRONIC DEVICE WITH FORCE ELEMENT

TECHNICAL FIELD

This disclosure generally relates to force elements for electronic devices. More particularly, the disclosure relates to force elements for electronic devices such as audio devices.

BACKGROUND

Conventional force elements in electronic devices can fail to adequately limit forces from components in such devices. For example, conventional force elements apply too much force to sensitive components during installation and/or use of the devices housing those components. This force can cause component damage and/or failure.

SUMMARY

All examples and features mentioned below can be combined in any technically possible way.

Various implementations include force elements for electronic devices, as well as electronic devices employing such force elements. The force elements are configured to limit forces applied to one or more components within the electronic devices, for example, during assembly, disassembly and/or use.

In some particular aspects, a force element includes: an outer ring surrounding a central axis and having a first diameter; an inner ring surrounding the central axis and having a second diameter that is smaller than the first diameter; an outer wall connecting a radially inner portion of the outer ring with a radially outer portion of the inner ring; an inner wall extending from a radially inner portion of the inner ring and located radially inboard of the outer wall; and a central platform extending from the inner wall around the central axis.

In other particular aspects, an electronic device includes: a circuit board; a device component separated from the circuit board; and a force element between the device component and the circuit board, the force element including: an outer ring surrounding a central axis and having a first diameter; an inner ring surrounding the central axis and having a second diameter that is smaller than the first diameter; an outer wall connecting a radially inner portion of the outer ring with a radially outer portion of the inner ring; an inner wall extending from a radially inner portion of the inner ring and located radially inboard of the outer wall; and a central platform extending from the inner wall around the central axis.

Implementations may include one of the following features, or any combination thereof.

In some cases, the inner wall is shaped as a cone and converges from the radially inner portion of the inner ring toward the central platform, and the inner wall is located radially inboard of the outer ring relative to the central axis.

In particular aspects, a gap exists between the inner wall and the outer wall, and an upper surface of the central platform is approximately coplanar with an upper surface of the outer ring.

In certain cases, the central platform includes a central disc.

In certain implementations, the inner ring and the outer ring are axially offset and radially offset relative to one another in a resting state.

In some aspects, a vertical cross-section of the force element approximates a "W" shape in the resting state.

In particular implementations, the inner wall translates a compressive force applied to the force element to the outer wall as the inner wall reaches a vertical compression limit.

In certain aspects, the outer wall has an angle of incidence with the inner ring of approximately 10 degrees to approximately 45 degrees, and the inner wall has an angle of incidence with the inner ring of approximately 10 degrees to approximately 45 degrees. In particular implementations, the angles of incidence are equal to approximately 20 degrees.

In some cases, a thickness of the inner wall is less than a thickness of the outer wall.

In certain implementations, a ratio of the thickness of the inner wall to the thickness of the outer wall is equal to approximately 1:1 to approximately 1:3.

In particular aspects, at least one of the inner wall or the outer wall buckles in response to a compressive force of approximately 30 Newtons (N) to approximately 230 N, and the force element has a spring constant of: approximately 20-90 N/millimeter (mm) from a resting state up to a buckling point, approximately 0 N/mm to approximately −60 N/mm during buckling, and approximately 20 N/mm to approximately 400 N/mm immediately after buckling.

In some implementations, the outer ring is sized to contact an underside of a component in the enclosure, and the inner ring is sized to contact a circuit board underlying the component.

In certain cases, the outer ring, the outer wall, the inner ring, the inner wall, and the central platform are unitary and formed of a material selected from: silicone, ethylene propylene diene monomer (EPDM) or a fluoroelastomer.

In some cases, the fluoroelastomer includes FKM.

In particular implementations, the material is flexible and stable from approximately −40 degrees C. to approximately 125 degrees C. and has a low compression set.

In some aspects, the outer ring contacts a side of the device component and the inner ring contacts a circuit board.

In particular cases, the circuit board contacts a quad flat pack (QFP) chip on an opposite side as the contact with the force element.

In certain cases, the QFP chip is located under the contact zone of the inner ring on the opposite side of the circuit board, and underlying the QFP is a heat sink. In various implementations, the force element absorbs force applied to the side of the device component to protect the QFP chip.

In some implementations, the electronic device includes an audio device.

Two or more features described in this disclosure, including those described in this summary section, may be combined to form implementations not specifically described herein.

The details of one or more implementations are set forth in the accompanying drawings and the description below. Other features, objects and benefits will be apparent from the description and drawings, and from the claims.

Figure 1:
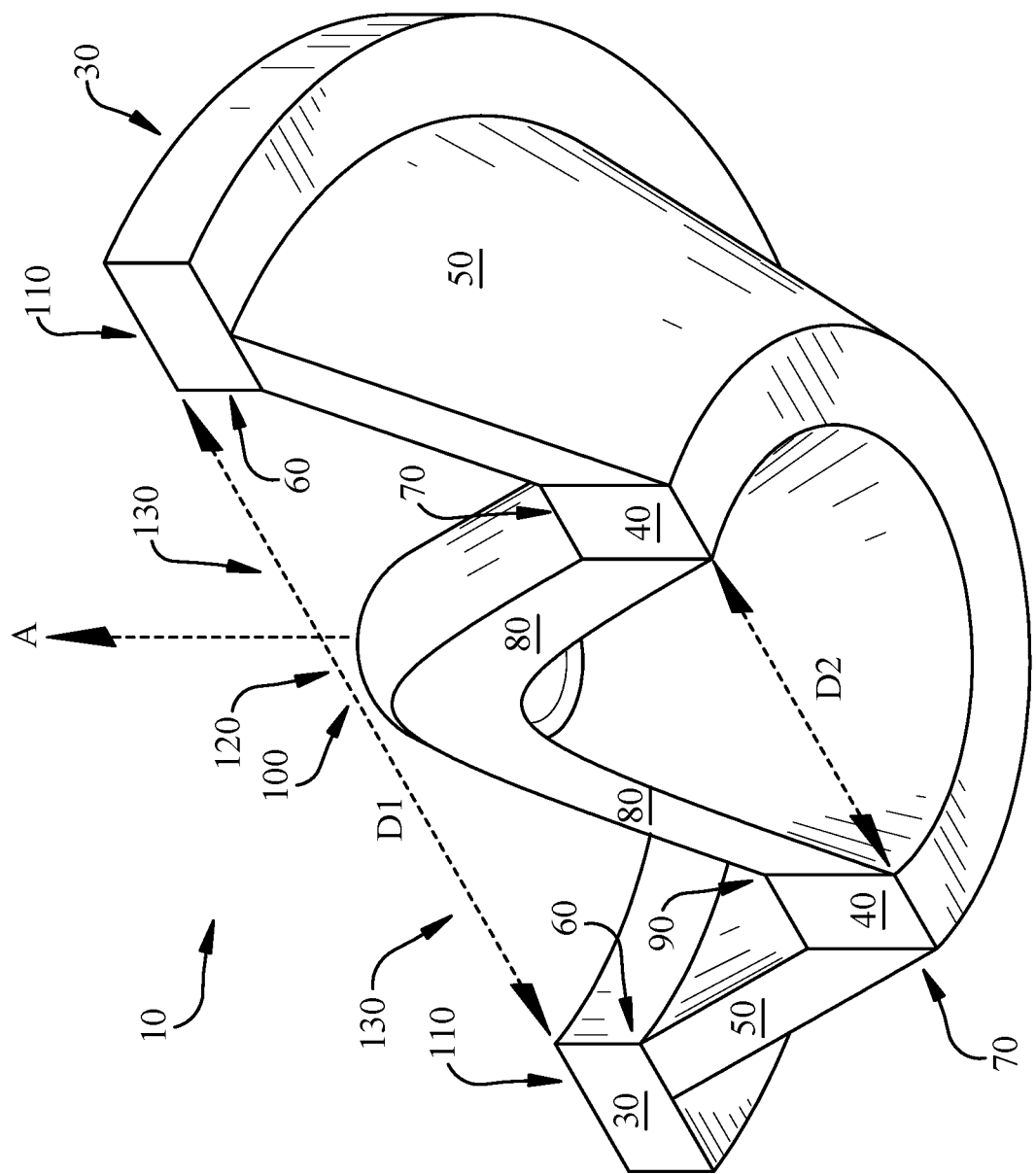
FIG. 1 is cut-away perspective view of a force element according to various implementations.

It is noted that the drawings of the various implementations are not necessarily to scale. The drawings are intended to depict only typical aspects of the disclosure, and therefore should not be considered as limiting the scope of the implementations. In the drawings, like numbering represents like elements between the drawings.

DETAILED DESCRIPTION

This disclosure is based, at least in part, on the realization that a force element with a double-conical structure can be employed in an electronic device to limit force applied to force-sensitive components. For example, a force element with inner and outer rings and corresponding walls can be positioned in an electronic device, such as an audio device, to absorb force applied to one or more components. In certain cases, the inner wall translates a compressive force applied to the force element to the outer wall as the inner wall reaches a vertical compression limit. The force element disclosed according to various implementations is configured to buckle across a greater range of force than conventional force elements, allowing for improved impact protection as compared with those conventional devices.

Commonly labeled components in the FIGURES are considered to be substantially equivalent components for the purposes of illustration, and redundant discussion of those components is omitted for clarity. Numerical ranges and values described according to various implementations are merely examples of such ranges and values, and are not intended to be limiting of those implementations. In some cases, the term "approximately" is used to modify values, and in these cases, can refer to that value +/-a margin of error, such as a measurement error, which may range from up to 1-5 percent.

Figure 2:
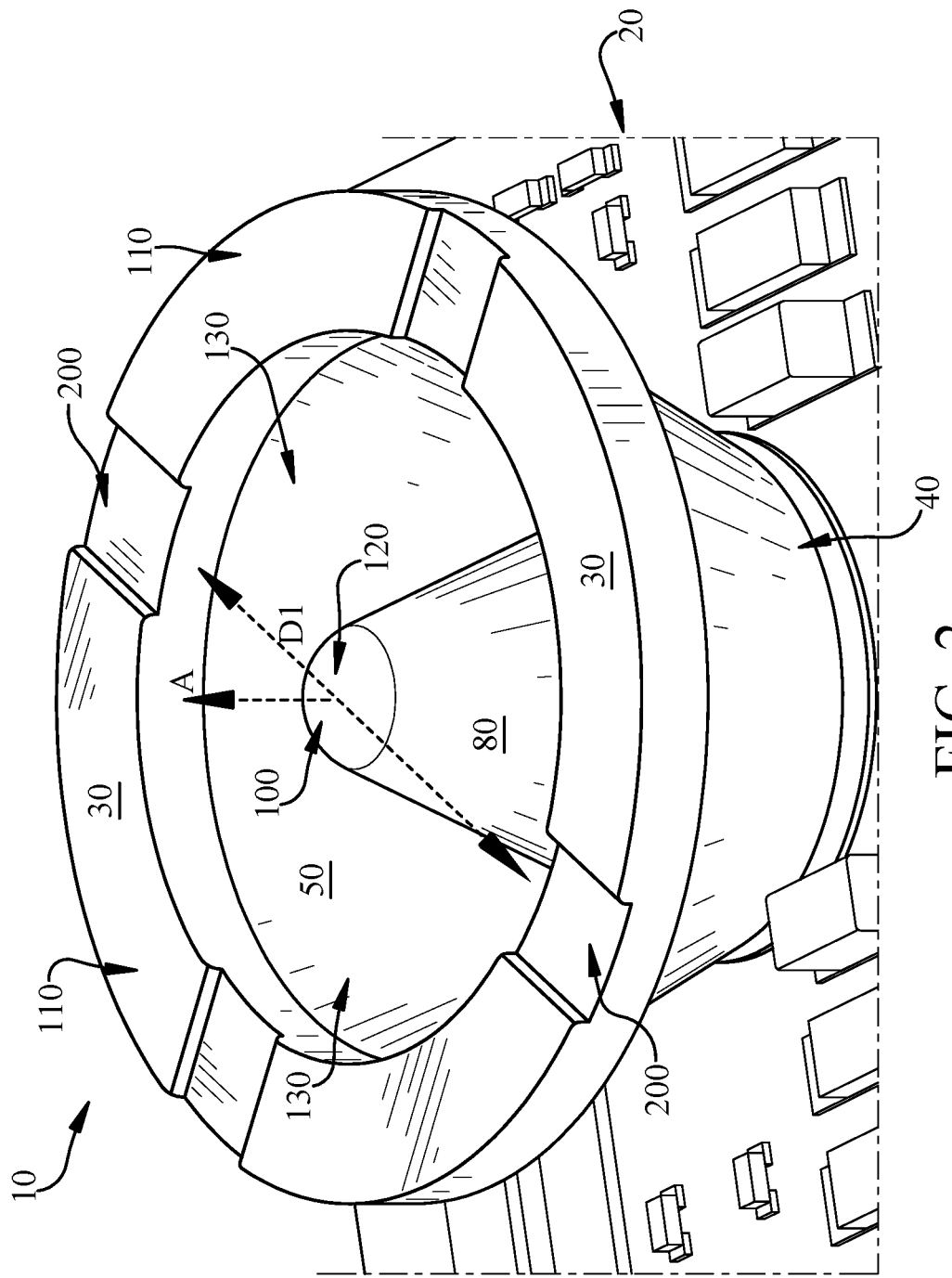
FIG. 2 shows a perspective view of the force element of FIG. 1 coupled with a circuit board, according to various implementations.
Figure 3:
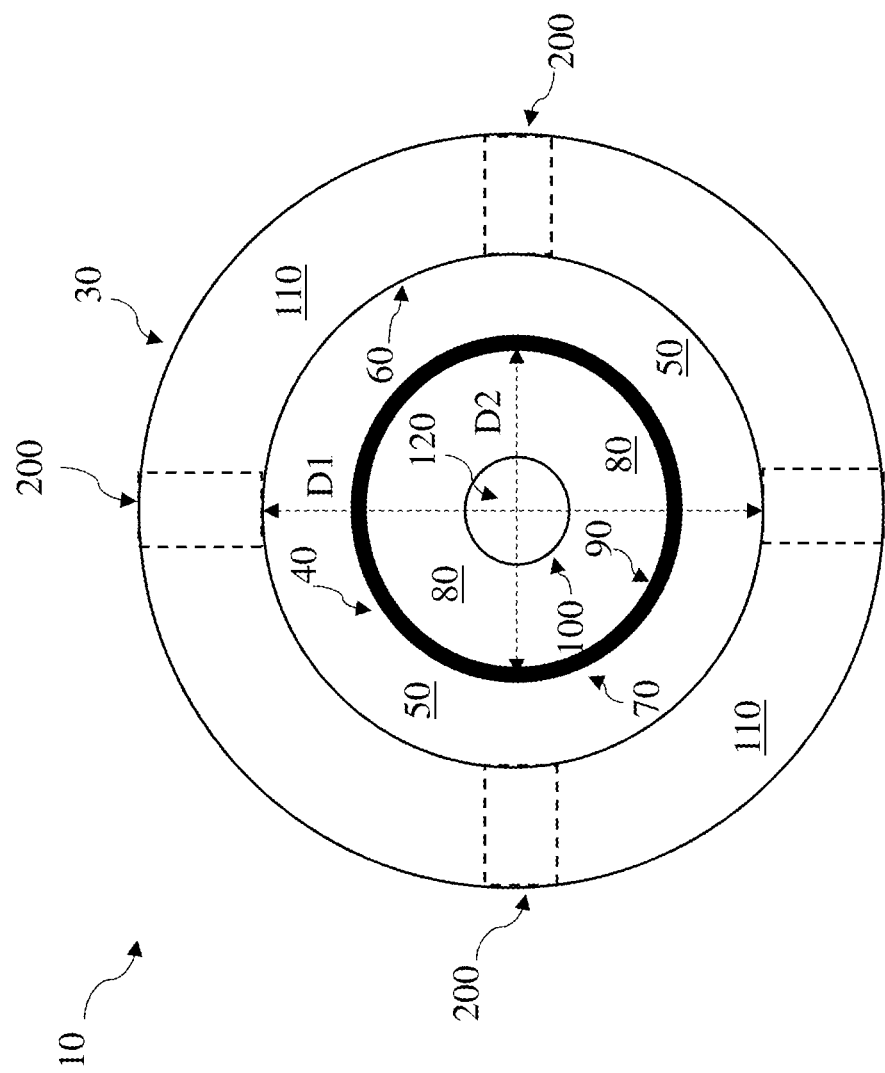
FIG. 3 shows a plan view of the force element of FIGS. 1 and 2.

FIG. 1 is a cut-away perspective view of a force element 10 according to various implementations. FIG. 2 shows a perspective view of the force element 10 coupled with a circuit board 20, for example, in a portion of an electronic device. FIG. 3 shows a plan view of the force element 10. These FIGURES are referred to simultaneously.

In particular cases, the force element 10 is shown including an outer ring 30 and an inner ring 40 each surrounding a central axis (A). The outer ring 30 is shown having a first diameter (D1), and the inner ring is shown having a second diameter (D2). In some cases, D1 and D2 are measured as inner diameters (IDs) of the rings 30, 40, however, in other cases, D1 and D2 are measured from a centerline through each of the rings 30, 40. In any case, the second diameter (D2) is smaller than the first diameter (D1).

In certain implementations, the force element 10 also includes an outer wall 50 connecting a radially inner portion 60 of the outer ring 30 with a radially outer portion 70 of the inner ring 40. In these cases, the force element 10 also includes an inner wall 80 extending from a radially inner portion 90 of the inner ring 40. As shown in FIGS. 1-3, the inner wall 80 is located radially inboard of the outer wall 50. It is understood that the terms "inboard" and "outboard" are used to describe the radial location of components relative to the central axis (A), such that relative to the axis (A), a component that is radially inboard of a distinct component is closer to the central axis (A) on a radial (perpendicular) line that extends from the axis (A).

Figure 4:
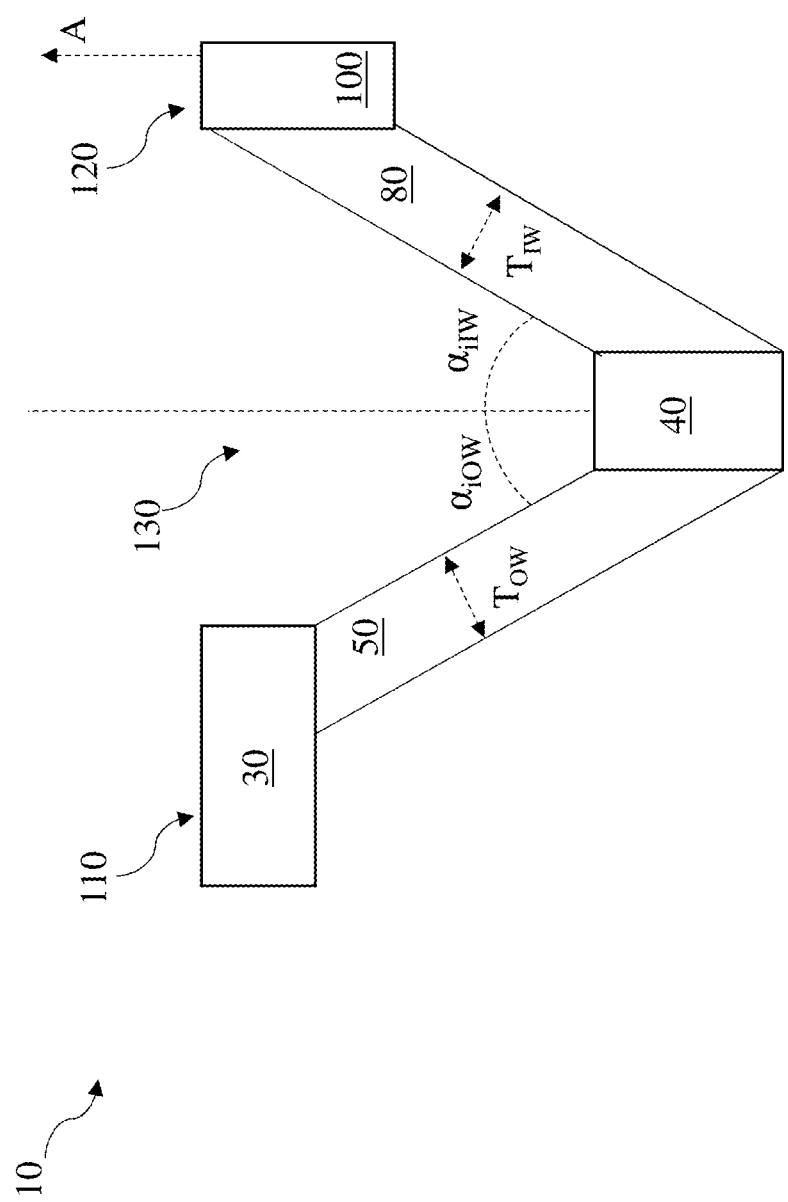
FIG. 4 is cross-sectional depiction of a portion of the force element of FIGS. 1-3.

As illustrated in FIGS. 1-3, the force element 10 also includes a central platform 100 extending from the inner wall 80 around the central axis (A) in various implementations. In certain implementations, the central platform 100 is approximately coplanar with an upper surface 110 of the outer ring 30. That is, an upper surface 120 of the central platform 100 is located at approximately a same height (or, axial location, such as along the direction of central axis (A)), as the upper surface 110 of the outer ring 30. FIG. 4 shows a cross-sectional depiction of a portion of the force element 10, illustrating one implementation where the upper surface 120 of the central platform 100 is approximately coplanar with the upper surface 110 of the outer ring 30. However, in other implementations, the central platform 100 is axially offset from the outer ring 30. In some example implementations, the central platform 100 includes a central disc, e.g., a substantially circular component as seen from the plan view in FIG. 3. In other cases, the central platform 100 takes a distinct shape, e.g., elliptical, oblong, rectangular or irregular.

As shown with particular detail in FIGS. 1 and 2, in some cases, the inner wall 80 is shaped as a cone and converges from the radially inner portion 90 of the inner ring 40 toward the central platform 100. That is, the inner wall 80 is located radially inboard of the outer ring 30 (relative to the central axis (A)), and a gap 130 exists between the inner wall 80 and the outer wall 50. In some cases, the gap 130 is defined by the divergence in the inner wall 80 and the outer wall 50 from the inner ring 40.

Turning specifically to FIGS. 1 and 4, with particular focus on FIG. 4, additional examples of dimensional aspects of the force element 10 are illustrated. In certain aspects, the outer wall 50 has an angle of incidence ($\alpha_{iOW}$) with the inner ring 40 of approximately 10 degrees to approximately 45 degrees, and the inner wall 80 has an angle of incidence ($\alpha_{iIW}$) with the inner ring 40 of approximately 10 degrees to approximately 45 degrees. In particular implementations, the angles of incidence are equal to approximately 20 degrees. In certain examples, a thickness ($T_{IW}$) of the inner wall 80 is less than a thickness ($T_{OW}$) of the outer wall 50. However, in various implementations, these thicknesses can be approximately equal. In particular example implementations, a ratio of the thickness ($T_{IW}$) of the inner wall 80 to the thickness ($T_{OW}$) of the outer wall 50 is equal to approximately 1:1 to approximately 1:3.

In certain cases, the force element 10 is a unitary component. In these cases, the outer ring 30, outer wall 50, inner ring 40, inner wall 80, and central platform 100 are unitary, i.e., formed as a single component, such as through an additive manufacturing process, casting, molding, etc. In other cases, the force element is composed of separately formed components that are bound together, e.g., with adhesive. In certain implementations, the force element 10 is formed of a material selected from: silicone, ethylene propylene diene monomer (EPDM) or a fluoroelastomer (e.g., FKM). In these cases, the force element 10 may be unitary. According to various implementations, the material from which the force element is composed is flexible and stable from approximately −40 degrees C. to approximately 125 degrees C. and has a low compression set, e.g., of approximately 25 percent or less, and in specific cases, approximately 10 percent or less.

In particular implementations, as illustrated in FIG. 1, a vertical cross-section (taken along a plane that intersects and runs parallel to the central axis (A)) of the force element 10 approximates a "W" in a resting state. In this sense, in a resting state, the inner ring 40 and outer ring 30 are axially offset and radially offset relative to one another. That is, the inner ring 40 and the outer ring 30 are positioned at different locations axially, as well as radially (i.e., relative to primary axis (A)).

Figure 5:
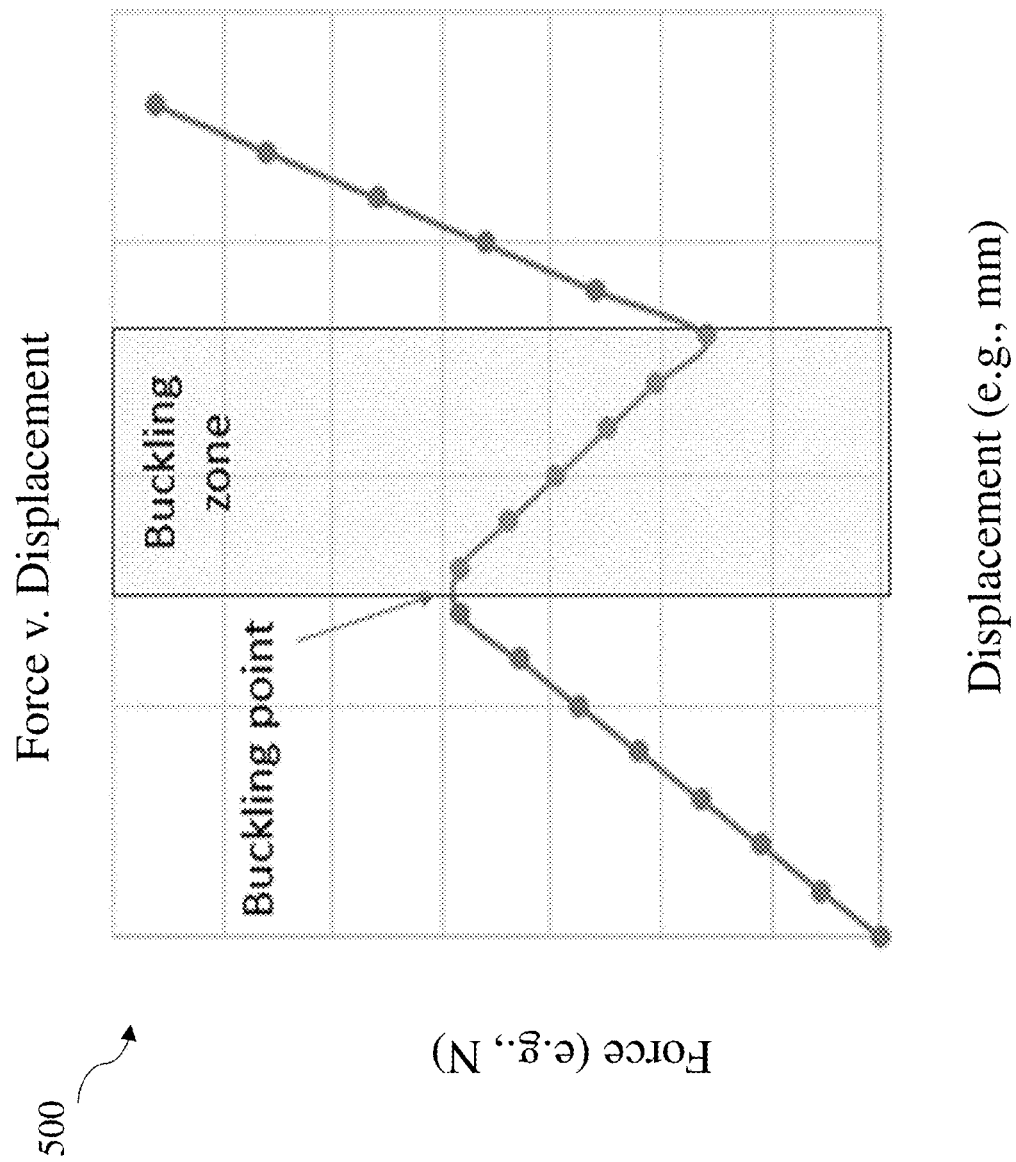
FIG. 5 is a graph illustrating buckling characteristics of a force element according to various example implementations.

In particular implementations, the inner wall 80 translates a compressive force applied to the force element 10 to the outer wall 50 as the inner wall 80 reaches a vertical compression limit. In some examples, at least one of the inner wall 80 or the outer wall 50 buckles in response to a compressive force of approximately 30 Newtons (N) to approximately 230 N. In certain example implementations, the force element 10 has a spring constant of: approximately 20-90 N/millimeter (mm) from the resting state up to the buckling point, approximately 0 N/mm to approximately −60 N/mm during buckling, and approximately 20 N/mm to approximately 400 N/mm immediately after buckling. FIG. 5 shows a graph 500 illustrating the concept of spring constant in a force element. That is, graph 500 illustrates characteristics of buckling in a force element such as force element 10, according to various implementations. Spring constant is illustrated in graph 500 using the relationship between force and displacement, e.g., with force in Newtons and displacement in millimeters. In this example depiction, the resting state can be depicted as the zero, zero point on graph 500, where force and displacement are both equal to zero.

Figure 6:
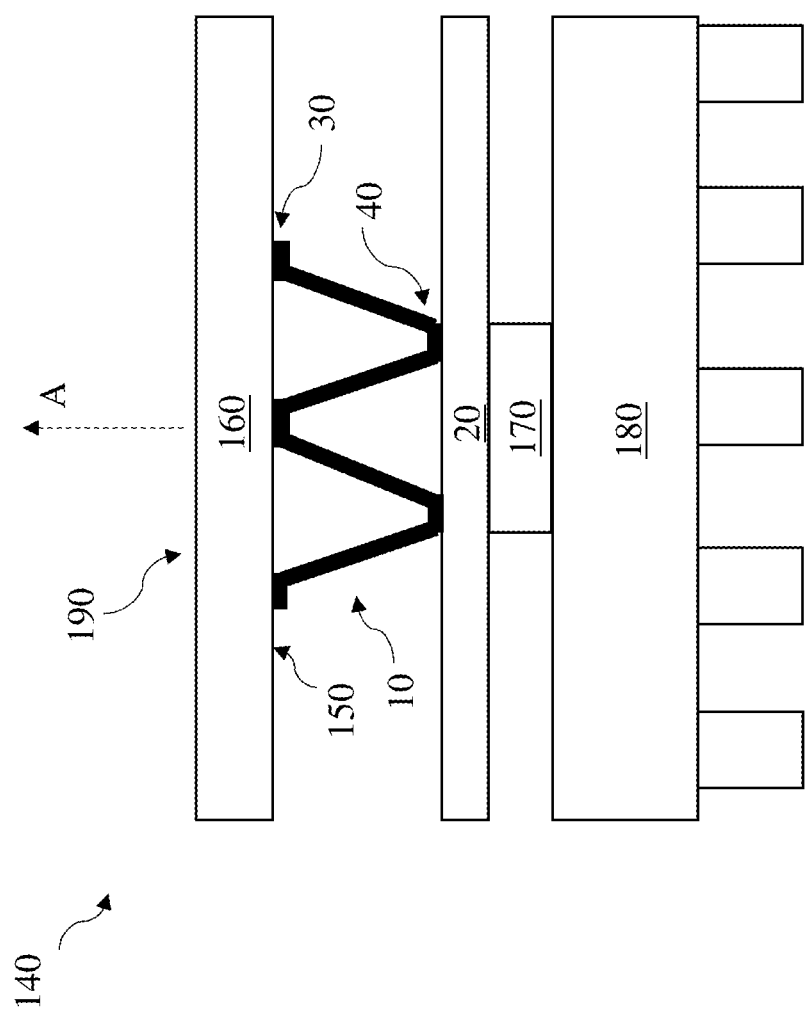
FIG. 6 shows a cross-sectional view of an electronic device including a force element according to various implementations.

FIG. 6 shows a cross-sectional view of a portion of an example electronic device 140 according to various implementations. In some examples, the electronic device 140 is an audio device with a circuit board 20 (e.g., as shown in FIG. 2) for controlling audio functions such as digital signal processing and amplification. The circuit board 20 is located under the force element 10 in various implementations. In particular cases, the inner ring 40 is sized to contact the circuit board 20, for example, a specific circuit on the circuit board 20. In these cases, the outer ring 30 is sized to contact an underside 150 of a component 160 (separated from the circuit board 20) in the electronic device. In certain implementations, the component 160 includes a portion of the device enclosure, such as a cover (e.g., back cover), which can be coupled to other components in the electronic device 140 with conventional fasteners. As illustrated in the example electronic device 140 in FIG. 6, a quad flat pack (QFP) chip 170 is coupled with the circuit board 20 on an opposite side of that circuit board 20 as the force element 10. It is understood that the QFP chip 170 is only one of a number of possible chips that can be positioned beneath the circuit board 20 and benefit from the presence of force element 10. In particular cases, the QFP chip 170 is located under the contact zone of the inner ring 40 on the opposite side of the circuit board 20. For example, the outer dimension of the inner ring 40 is equal to approximately the outer dimension of the QFP chip 170 as measured in a radial direction in various implementations. According to some implementations, the electronic device 140 also includes a heat sink 180 below the QFP chip 170. In this example configuration, the QFP chip 170 is vulnerable to damage from force, for example, compressive force. That is, in various implementations, the force element 10 limits force applied to the upper side 190 of the device component 160 to protect the QFP chip 170.

It is understood that in additional implementations, the force element 10 can be inverted or otherwise reoriented to protect particular components in a device, e.g., electronic device 140. That is, the force element 10 may be reoriented such that the outer ring 30 is positioned above the inner ring 40, or may be rotated to any orientation suitable to protect components in a device. In some optional implementations, the force element 10 includes a vent 200 (FIG. 2, FIG. 3) or other opening for permitting airflow through the force element 10 during compression. In certain cases, the vent 200 is a radially extending slot that traverses at least a portion of the upper surface 110 of the outer ring 30.

In contrast to conventional force elements, such as springs, foam, or compressible buttons, the force element 10 is configured to limit force by permitting buckling at both the outer wall 50 and the inner wall 80. That is, the dual-wall (or, dual-cone) structure of the force element 10 allows compressive force to be translated between the walls, which when compared with conventional force elements, increases the allowable buckling point force on the force element 10 while maintaining a compact geometry. In particular examples described herein, the inner wall 80 translates a compressive force applied to the force element 10 to the outer wall 50 as the inner wall 80 reaches a vertical compression limit. In these examples, the inner wall 80 translates the initial force required to support the inner ring 40 until the outer wall 50 buckles, and the inner wall 80 subsequently buckles after it reaches its vertical compression limit. In any case, the force element 10 is configured to absorb greater force, over a longer period, than conventional force elements.

One or more components in the electronic devices described herein can be formed of any conventional electronic device material, e.g., a heavy plastic, metal (e.g., aluminum, or alloys such as alloys of aluminum), composite material, etc. It is understood that the relative proportions, sizes and shapes of the transducer(s) and components and features thereof as shown in the FIGURES included herein can be merely illustrative of such physical attributes of these components. That is, these proportions, shapes and sizes can be modified according to various implementations to fit a variety of products.

In various implementations, components described as being "coupled" to one another can be joined along one or more interfaces. In some implementations, these interfaces can include junctions between distinct components, and in other cases, these interfaces can include a solidly and/or integrally formed interconnection. That is, in some cases, components that are "coupled" to one another can be simultaneously formed to define a single continuous member. However, in other implementations, these coupled components can be formed as separate members and be subsequently joined through known processes (e.g., soldering, fastening, ultrasonic welding, bonding).

A number of implementations have been described. Nevertheless, it will be understood that additional modifications may be made without departing from the scope of the inventive concepts described herein, and, accordingly, other implementations are within the scope of the following claims.

I claim:

1. A force element for an electronic device, the force element comprising:
   an outer ring surrounding a central axis and comprising a first diameter;
   an inner ring surrounding the central axis and comprising a second diameter that is smaller than the first diameter;
   an outer wall connecting a radially inner portion of the outer ring with a radially outer portion of the inner ring;

an inner wall extending from a radially inner portion of the inner ring and located radially inboard of the outer wall; and a central platform extending from the inner wall around the central axis, wherein the outer wall has an angle of incidence with the inner ring of approximately 10 degrees to approximately 45 degrees, and wherein the inner wall has an angle of incidence with the inner ring of approximately 10 degrees to approximately 45 degrees.

2. The force element of claim 1, wherein the inner wall is shaped as a cone and converges from the radially inner portion of the inner ring toward the central platform, and wherein the inner wall is located radially inboard of the outer ring relative to the central axis.

3. The force element of claim 2, wherein a gap exists between the inner wall and the outer wall, and wherein an upper surface of the central platform is approximately coplanar with an upper surface of the outer ring.

4. The force element of claim 1, wherein the inner ring and the outer ring are axially offset and radially offset relative to one another in a resting state.

5. The force element of claim 4, wherein a vertical cross-section of the force element approximates a "W" shape in the resting state.

6. The force element of claim 1, wherein the inner wall translates a compressive force applied to the force element to the outer wall as the inner wall reaches a vertical compression limit.

7. The force element of claim 1, wherein a thickness of the inner wall is less than a thickness of the outer wall.

8. The force element of claim 7, wherein a ratio of the thickness of the inner wall to the thickness of the outer wall is equal to approximately 1:1 to approximately 1:3.

9. The force element of claim 1, wherein at least one of the inner wall or the outer wall buckles in response to a compressive force of approximately 30 Newtons (N) to approximately 230 N, and wherein the force element has a spring constant of: approximately 20-90 N/millimeter (mm) from a resting state up to a buckling point, approximately 0 N/mm to approximately −60 N/mm during buckling, and approximately 20 N/mm to approximately 400 N/mm immediately after buckling.

10. The force element of claim 1, wherein the outer ring is sized to contact an underside of a component in the electronic device enclosure, and wherein the inner ring is sized to contact a circuit board underlying the component.

11. The force element of claim 1, wherein the outer ring, the outer wall, the inner ring, the inner wall, and the central platform are unitary and formed of a material selected from: silicone, ethylene propylene diene monomer (EPDM) or a fluoroelastomer.

12. An electronic device, comprising:
a circuit board;
a device component separated from the circuit board; and
a force element between the device component and the circuit board, the force element comprising:
an outer ring surrounding a central axis and comprising a first diameter;
an inner ring surrounding the central axis and comprising a second diameter that is smaller than the first diameter;
an outer wall connecting a radially inner portion of the outer ring with a radially outer portion of the inner ring;
an inner wall extending from a radially inner portion of the inner ring and located radially inboard of the outer wall; and
a central platform extending from the inner wall around the central axis,
wherein the outer wall has an angle of incidence with the inner ring of approximately 10 degrees to approximately 45 degrees, and wherein the inner wall has an angle of incidence with the inner ring of approximately 10 degrees to approximately 45 degrees.

13. The electronic device of claim 12, wherein the inner wall is shaped as a cone and converges from the radially inner portion of the inner ring toward the central platform, wherein the inner wall is located radially inboard of the outer ring relative to the central axis, wherein a gap exists between the inner wall and the outer wall, and wherein an upper surface of the central platform is approximately coplanar with an upper surface of the outer ring.

14. The electronic device of claim 12, wherein the inner ring and the outer ring are vertically offset and radially offset relative to one another in a resting state, and wherein a vertical cross-section of the force element approximates a "W" shape in the resting state.

15. The electronic device of claim 12, wherein the inner wall translates a compressive force applied to the force element to the outer wall as the inner wall reaches a vertical compression limit.

16. The electronic device of claim 12, wherein a ratio of a thickness of the inner wall to a thickness of the outer wall is equal to approximately 1:1 to approximately 1:3.

17. The electronic device of claim 12, wherein at least one of the inner wall or the outer wall buckles in response to a compressive force of approximately 30 Newtons (N) to approximately 230 N, and wherein the force element has a spring constant of: approximately 20-90 N/millimeter (mm) from a resting state up to a buckling point, approximately 0 N/mm to approximately −60 N/mm during buckling, and approximately 20 N/mm to approximately 400 N/mm immediately after buckling.

18. The electronic device of claim 12, wherein the outer ring contacts a side of the device component, wherein the inner ring contacts the circuit board, and wherein the electronic device comprises an audio device.

19. The electronic device of claim 12, wherein the outer ring, the outer wall, the inner ring, the inner wall and the central platform are unitary and formed of a material selected from: silicone, ethylene propylene diene monomer (EPDM) or a fluoroelastomer.

20. A force element for an electronic device, the force element comprising:
an outer ring surrounding a central axis and comprising a first diameter;
an inner ring surrounding the central axis and comprising a second diameter that is smaller than the first diameter;
an outer wall connecting a radially inner portion of the outer ring with a radially outer portion of the inner ring;
an inner wall extending from a radially inner portion of the inner ring and located radially inboard of the outer wall; and
a central platform extending from the inner wall around the central axis,
wherein the inner wall translates a compressive force applied to the force element to the outer wall as the inner wall reaches a vertical compression limit.

21. The force element of claim 20, wherein the inner wall is shaped as a cone and converges from the radially inner portion of the inner ring toward the central platform, and wherein the inner wall is located radially inboard of the outer ring relative to the central axis.

22. The force element of claim 20, wherein a gap exists between the inner wall and the outer wall, and wherein an upper surface of the central platform is approximately coplanar with an upper surface of the outer ring.

23. The force element of claim 20, wherein the inner ring and the outer ring are axially offset and radially offset relative to one another in a resting state.

24. The force element of claim 20, wherein a vertical cross-section of the force element approximates a "W" shape in the resting state.

25. The force element of claim 20, wherein the outer ring is sized to contact an underside of a component in the electronic device, and wherein the inner ring is sized to contact a circuit board underlying the component.

* * * * *